United States Patent [19]

Hoshizaki

[11] Patent Number: 5,566,127

[45] Date of Patent: Oct. 15, 1996

[54] METHOD FOR BUILDING A COMPILED STATIC RAM

[75] Inventor: Gary W. Hoshizaki, Mesa, Ariz.

[73] Assignee: Motorola, Inc., Schaumburg, Ill.

[21] Appl. No.: 345,876

[22] Filed: Nov. 28, 1994

Related U.S. Application Data

[62] Division of Ser. No. 820,830, Jan. 15, 1992, abandoned.

[51] Int. Cl.$^6$ .................................................. G11C 8/00
[52] U.S. Cl. .......................... 365/230.06; 365/230.03; 365/233; 365/154
[58] Field of Search .................... 365/230.06, 230.03, 365/154, 156, 233, 230.08; 326/105

[56] References Cited

U.S. PATENT DOCUMENTS

| | | | |
|---|---|---|---|
| 5,124,951 | 6/1992 | Slemmer et al. | 365/230.06 |
| 5,128,897 | 7/1992 | McClure | 365/230.06 |
| 5,225,240 | 10/1993 | Wong | 365/230.06 |
| 5,301,144 | 4/1994 | Kohno | 365/230.06 X |

*Primary Examiner*—David C. Nelms
*Assistant Examiner*—Huan Hoang
*Attorney, Agent, or Firm*—Gary W. Hoshizaki

[57] ABSTRACT

A static random access memory (SRAM) that is configurable for different word widths and memory sizes, and a method for forming the physical layout with blocks of a SRAM are described. In the physical layout of the SRAM, a central block structure (54) is formed which includes clock buffers (28), a delayed clock buffer (29), row address buffers (27), row deselect circuits (21), row driver circuits (22), output level translators, and a data bus interface. Memory block macros (35) are formed that include a block of memory, precharge circuits, read/write multiplexers, and sense amplifiers. Memory block macros (35) are symmetrically located around the central block structure (54), and may also include a block deselect circuit (39) and rox/block decoders (38) if multiple memory blocks are used. A deselection process may be used in which the SRAM selects a bit or word by deselection. All memory blocks and memory rows are initially selected with the only a single block and row remaining selected after the deselection process. Block deselect circuits (39) deselect memory blocks (89). Row deselect circuits (21) deselect row drivers (22) from enabling memory rows of memory blocks (89). A delayed clock buffer (29) provides a delayed clock signal for preventing row drivers (22) from enabling a memory row during the deselect process.

10 Claims, 6 Drawing Sheets

FIG. 1
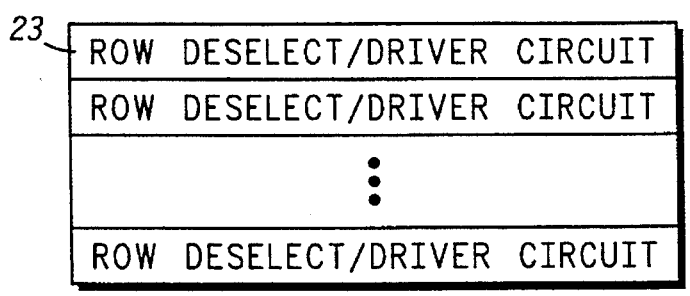
FIG. 2
FIG. 3
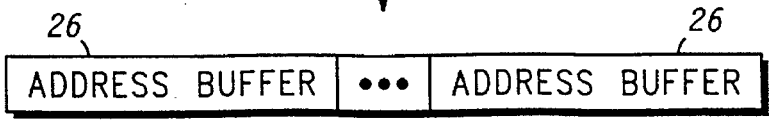
FIG. 4

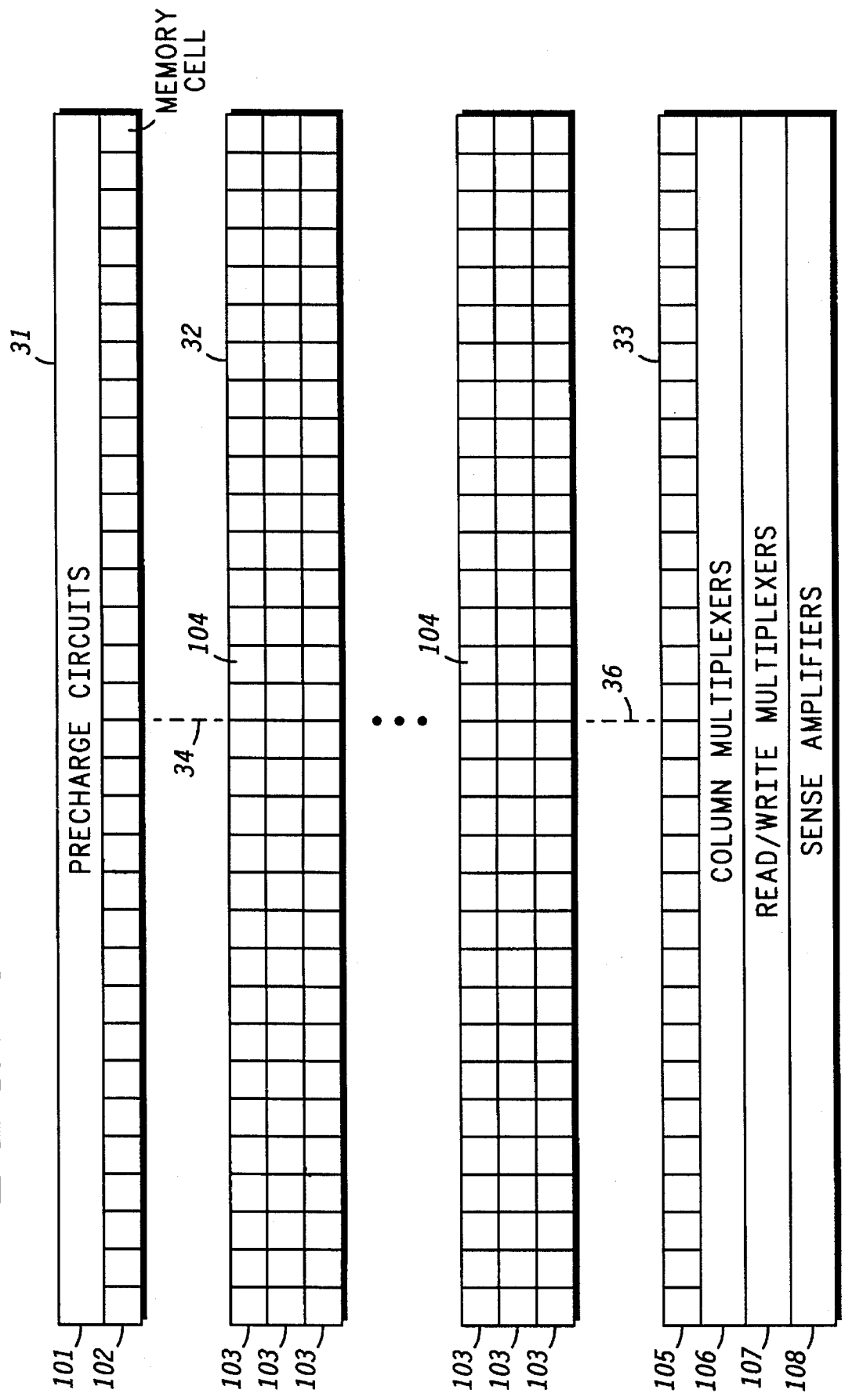

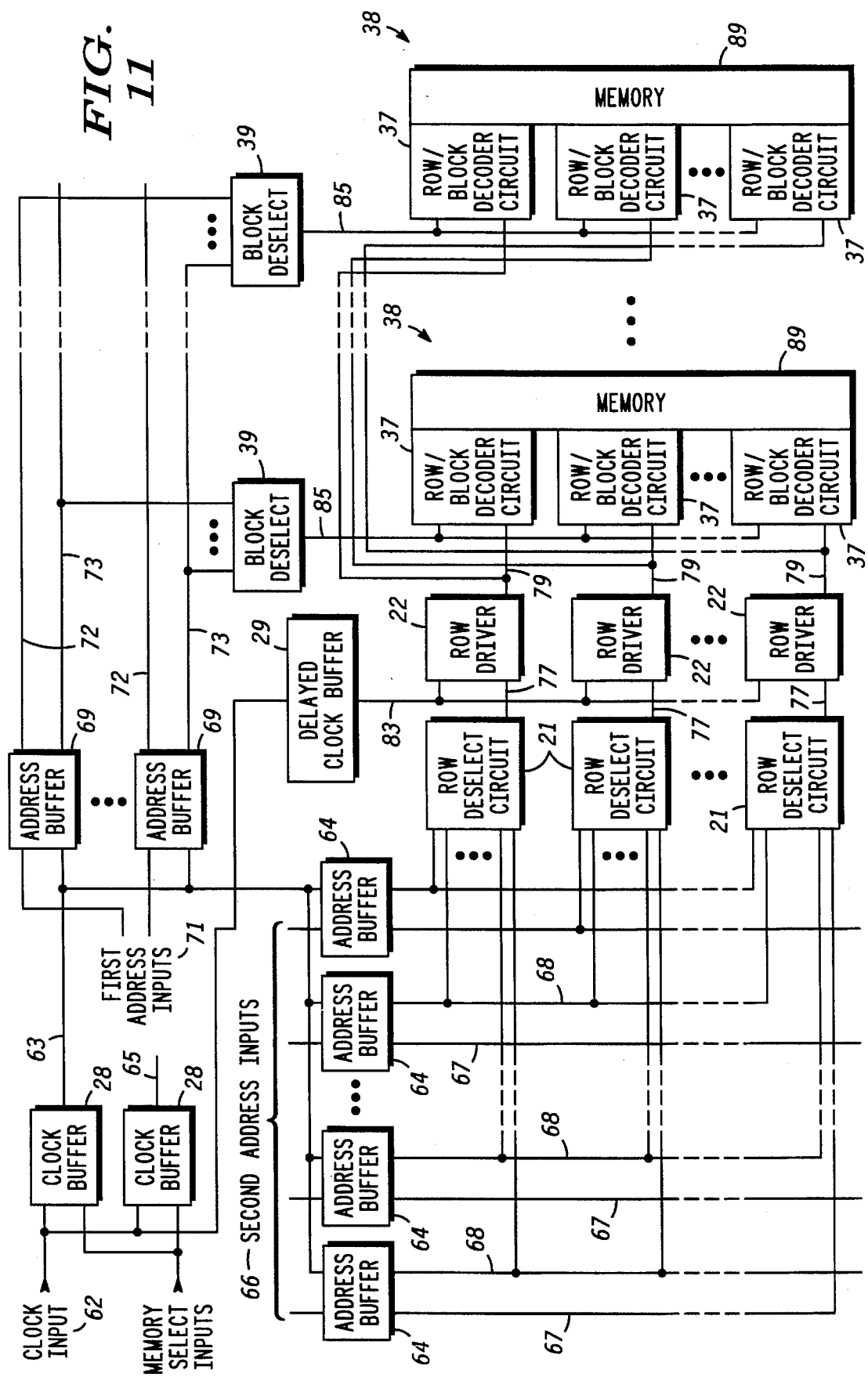

METHOD FOR BUILDING A COMPILED STATIC RAM

This is a division of application Ser. No. 07/820,830, filed Jan. 15, 1992 now abandoned.

BACKGROUND OF THE INVENTION

This invention relates, in general, to static random access memories (SRAMs), and more particularly to SRAMs designed to be automatically generated by a computer.

A SRAM compiler is a computer program which can synthesize different memory configurations. Variables which determine a specific memory configuration are word width, number of words, and number of memory blocks. A SRAM compiler program creates a netlist of the memory, simulates the worst case delay path through the memory to generate timing information, builds a symbol of the SRAM for placement in a schematic, builds a simulation model with the timing information, creates a physical layout of the SRAM, builds a routing abstraction of the SRAM, and creates a power grid structure for the SRAM. In general, a SRAM compiler is used to generate memories for application specific integrated circuits (ASICs) such as a gate array or a standard cell circuit. A compiled SRAM may be one of many components which make up an integrated circuit.

A netlist of a SRAM is a schematic diagram of the SRAM stored on a computer. The netlist includes all elements which comprise the SRAM such as transistors, resistors, and capacitors as well as the interconnections between all the elements. The netlist can also be a hierarchical description having different levels, each level being a different description of the SRAM. For example, a first level could be a symbol of the SRAM with a corresponding table having timing parameters of the SRAM. A second level could be a block level schematic diagram of the SRAM. Each block of the block level schematic having its own table of timing parameters. A third level could be a transistor level schematic diagram of the SRAM. In general, the netlist is a description of the SRAM and is used for simulation and layout generation of the SRAM.

A SRAM generated by a compiler contrasts greatly with a SRAM designed for the general marketplace as a stand alone part. Typically, general product SRAMs are full custom designs which focus on memory density, speed, power, yield, and package size. All of these constraints must be met within a short design cycle time to introduce a successful SRAM in a highly competitive market. Due to the large size of these memories (256K bits and larger) block architecture's are used almost exclusively to meet SRAM target access speeds. The trend in full custom SRAM design is to build in limited configurability. Architecture's which allow variable word widths of the most common sizes are designed into the memory which decreases design cycle time. Also, large SRAMs are designed so they can be modified to a smaller configuration (for example 256K to 64K). This allows parts to be salvaged if yields are poor at the larger memory size or a faster version of the SRAM may be offered in the smaller configuration.

Creating the SRAM compiler is a task which involves both design and computer resources. Memory sizes and word widths on an ASIC can vary drastically depending on the customer application. Initial efforts attempted to take existing full custom memory designs and build them into memory compilers. Writing the computer code to create a configurable memory from a full custom design proved to be an extremely difficult task. Most abandoned this approach and created new memory designs which simplified writing the code to synthesize various memory configurations and reduce the complexity of building the physical layout of the SRAM.

Two features are typical of most SRAM compiler designs. First, the compiler builds a single block of memory for the application. Second, decoding stages are designed to minimize layout changes which reduces the complexity of the physical layout compiler. For large memory sizes both of these standard compiler attributes reduce SRAM performance. Larger memory array sizes increase loadings on outputs of decoder circuits and memory cells, decreasing SRAM access times. Building the decoding circuits to simplify layout changes often compromises performance for high row/column counts.

ASIC users are building complex integrated circuits using standard cell and gate array approaches. Large circuit blocks such as microprocessor core (a microprocessor circuit for use in an ASIC, typically stripped of its high drive outputs and other circuitry not essential for an embedded use within an ASIC), ROM, SRAM, multipliers, and register files are common elements used within an integrated circuit design. The user integrates these elements on a single integrated circuit (or multiple integrated circuits) to reduce component count and increase system speed. In general, large amounts of memory are required in complex integrated circuit designs. The memory required typically takes the form of a large single SRAM or multiple smaller SRAMs. The main limitation in a SRAM generated by a computer (compiled SRAM) is performance. The memory size is dictated by the largest SRAM that can be formed that meets the system speed requirements of an integrated circuit. Users expect performance levels similar to those of standard SRAM parts sold on the market. Presently, compilers have been unable to generate SRAMs approaching the speed/density of the full custom SRAM designs.

Accordingly, it would be desirable to provide an SRAM design having a structure that is easily generated for different configurations yet approaches speeds/densities of full custom SRAM designs.

BRIEF DESCRIPTION OF THE DRAWINGS

FIG. 1 illustrates a simplified layout boundary of a row deselect circuit, a layout boundary is a physical boundary of a circuit wherein all components which comprise the circuit reside within the layout boundary;

FIG. 2 illustrates a simplified layout boundary of a row deselect circuit abutted to a row driver circuit, forming a first row deselect/driver circuit;

FIG. 3 illustrates a simplified layout boundary of the first row deselect/driver replicated for the specific number of rows in the SRAM and formed into a column of abutted first row deselect/drivers;

FIG. 4 illustrates a simplified layout boundary of an address buffer replicated for a specific number of addresses in the SRAM and formed into a row of abutted address buffers;

FIG. 6 shows a first substructure abutted to a second substructure and a third substructure abutted to the second substructure;

FIG. 11 shows a block diagram of the row and block decode architecture of the SRAM.

DETAILED DESCRIPTION OF THE PREFERRED EMBODIMENT

Figure 5:
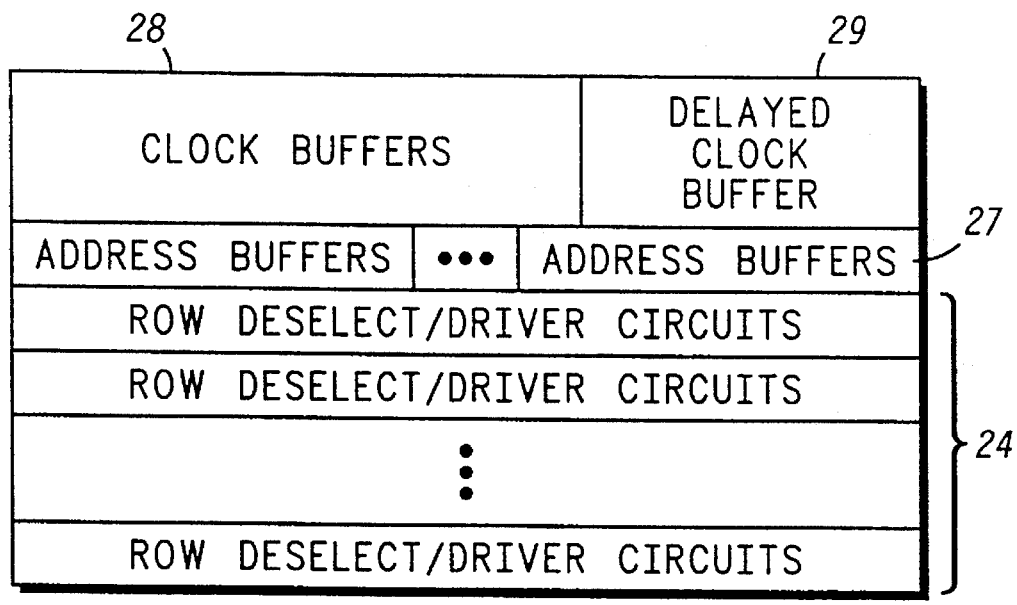
FIG. 5 illustrates the row of address buffers abutted to the top of the column of row deselect/drivers.

The building blocks used by the block architected SRAM compiler will be described first and then one implementation of the blocks will be illustrated. Again, a layout boundary is a physical boundary of a circuit wherein all components which comprise the circuit reside within the layout boundary.

FIG. 1 illustrates a simplified layout boundary representing the layout boundary of a row deselect circuit 21. Row deselect circuit 21 selects a memory cell row in the SRAM using a deselection process. How row deselect circuit 21 is formed for different SRAM configurations and its specific layout within the simplified layout boundary is heavily influenced by circuit design.

FIG. 2 illustrates a simplified layout boundary of a row deselect circuit 21 abutted to a row driver circuit 22. The row driver circuit 22 buffers row deselect circuit 21 from capacitive and resistive loads. Row deselect circuit 21 and row driver circuit 22 are referred to, herein, as a row deselect/ driver circuit 23.

A layout boundary of a memory cell or other circuits described herein are shown as rectangular in shape to simplify arraying or placing circuit layouts next to one another. For example, a memory cell is formed into a memory block composed of rows and columns of memory cells by arraying the physical layout of the memory cell such that the layout boundaries of the memory cells are adjacent to one another. The layout boundary of a memory cell is described by a height and a width which corresponds to the area it displaces when formed on a semiconductor wafer. In the preferred embodiment, the layout boundary of row deselect/driver circuit 23 is built to a height equal to that of a memory cell.

FIG. 3 is an illustration of the row deselect/driver circuit 23 of FIG. 2 replicated or arrayed to form a column of row deselect/driver circuits 24. The column of row deselect/ driver circuits 24 is arrayed having a row deselect/driver circuit 23 for each memory cell row in the SRAM.

FIG. 4 illustrates a simplified layout boundary of an address buffer 26 arrayed to form a row of address buffers 27. The number of address buffers 26 in the row of address buffers 27 corresponds to the number of address inputs to the SRAM.

FIG. 5 is an illustration of the row of address buffers 27 of FIG. 4 abutted to the column of row deselect/driver circuits 24 of FIG. 3. In the preferred embodiment, the layout boundary of the row of address buffers 27 is not wider than the width of the layout boundary of the column of row deselect/driver circuits 24.

Also illustrated in FIG. 5 is a simplified layout boundary of a plurality of clock buffers 28 abutted to a layout boundary of a delayed clock buffer 29. The plurality of clock buffers 28 and the delayed clock buffer 29 abut the row of address buffers 27. The clock buffers 28, the delayed clock buffer 29, and the row of address buffers 27 have inputs (not shown) for receiving logic signals from circuitry external to the SRAM. The location of the plurality of clock buffers 28, the delayed clock buffer 29, and the row of address buffers 27 allow the inputs of these circuits to be accessible to circuits external to the SRAM yet minimize interconnect distance for coupling to circuitry in the SRAM critical delay path.

FIG. 6 illustrates a simplified layout boundary of a first substructure 31, a simplified layout boundary of a second substructure 32, and a simplified layout boundary of a third substructure 33. The dotted line 34 illustrates a bottom of first substructure 31 abutting a top of second substructure 32. The dotted line 36 illustrates a bottom of second substructure 32 abutting the top of third substructure 33.

In the preferred embodiment, first substructure 31 comprises a row of precharge circuits 101 and a memory cell row 102. The layout boundary of the row of precharge circuits 101 is built having a width equal to or less than the memory cell row 102 layout boundary. The layout boundary of row of precharge circuits 101 abuts layout boundary of the memory cell row 102.

First substructure 31 is built in three different configurations: a first version having 32 memory cell columns, a second version having 36 memory cell columns, and a third version having 40 memory cell columns. A physical layout of each version is built such that the compiler uses one of the three versions for building the layout of the SRAM.

The word width of the SRAM determines which of the three different configurations of first substructure 31 is used. Limiting the first substructure 31 to three different layout configurations does not compromise word width variability. Limiting the first substructure 31 to one of the three different configurations does decrease the number of SRAM configurations for a specific memory size. Also, development time on the SRAM compiler is reduced because first substructure 31 exists as the three different layout blocks (32, 36, and 40 columns) and a new physical layout does not have to be generated specifically for each new SRAM configuration.

A compiler is an alternative for generating the first substructure 31 instead of the three fixed layouts described above. The area required by the three different configurations of first substructure 31 is reduced by customizing the fixed layouts when compared to an equivalent first substructure 31 formed by a compiler from smaller circuit blocks.

In the preferred embodiment, a physical layout of second substructure 32 is built or formed by a compiler program. The second substructure 32 is a block of memory defined by a number of memory cell rows and a number of memory cell columns. The physical layout is formed by tiling memory cells together. Tiling as the name implies is the placement of memory cells next to one another to form a memory block having a predetermined number of rows and columns. The number of memory cell columns in the second substructure 32 are determined by the SRAM word width and are limited to configurations of 32 memory cell columns, 36 memory cell columns, and 40 memory cell columns. The number of second memory cell rows in the second substructure 32 is determined by memory size, word width, and a number of memory blocks used to build the SRAM. The memory cell row 102 of first substructure 31 abuts the second substructure 32 as indicated by dotted line 34.

In the preferred embodiment, third substructure 33 comprises a memory cell row 105, column multiplexers 106, read/write multiplexers 107, and sense amplifiers 108. The memory cell row 105 is placed at the top of third substructure 33. The column multiplexers 106 abut the memory cell row 105. The read/write multiplexers 107 abut the column multiplexers 106. The sense amplifiers 108 abut the bottom of the read/write multiplexers 107.

Third substructure 33 is built in three different configurations having 32 memory cell columns, 36 memory cell columns, and 40 memory cell columns, similar to the first and second substructures 31 and 32. Each of the three configurations of the third substructure 33 is built as a separate physical layout which is used by the compiler for forming the SRAM. The SRAM word width determines which configuration of third substructure 33 is used (32, 36, or 40 columns). The memory cell row 105 of the third substructure 33 abuts the second substructure as indicated by dotted line 36.

The memory cell row 102 of first substructure 31, the memory cell rows 103 of second substructure 32, and the memory cell row 105 of third substructure 33 combine to form a memory block having a number of memory cell rows and columns determined by the size and word width of the SRAM.

In the preferred embodiment, the sense amplifiers 108 are broken into two separate circuits, a sense amplifier input differential circuit and a sense amplifier load circuit. The sense amplifier input differential circuits are abutted to the bottom of the read/write multiplexers of third substructure 33. The sense amplifier load circuits are not placed in third substructure 33. This reduces congestion caused by the number of circuits placed in third substructure 33 and saves area in them SRAM by sharing sense amplifier load circuits for SRAMs with multiple memory blocks.

Prior art memory compilers have required significant amount of programming to piece together each individual circuit (memory cells, precharge circuits, multiplexers, read/write multiplexers, etc.) for the predetermined memory block size. Building the first substructure 31 and third substructure 33 as fixed layout blocks significantly reduces the complexity of the compiler and reduces the area the SRAM occupies. The SRAM word width determines which of the three configurations of the first substructure 31 and third substructure 33 is used in the SRAM. Memory block size is determined by building the second substructure with the predetermined number of memory cell rows. Both the first substructure 31 and third substructure 33 have a memory cell row built-in to simplify abutment to the second substructure 32.

Figure 7:
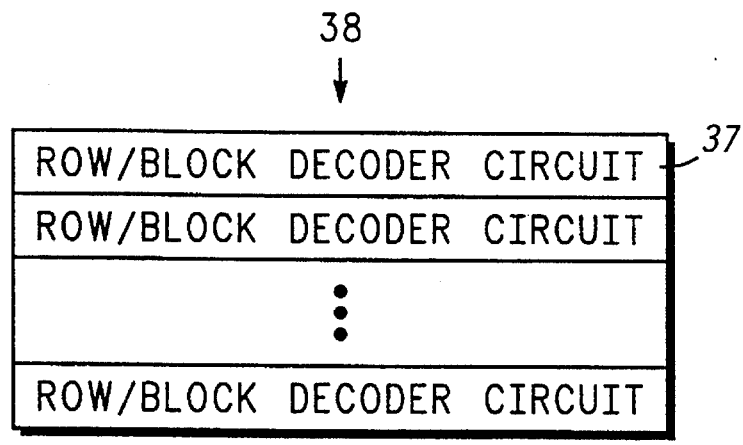
FIG. 7 illustrates a simplified layout boundary of a row/block decoder replicated for the specific number of rows in the SRAM and formed into a column of abutted row/block decoders.

FIG. 7 illustrates a simplified layout boundary of a row/block decoder circuit 37. The row/block decoder circuit 37 is replicated for the predetermined number of memory cell rows a memory block in the SRAM. The row/block decoder circuits 37 are abutted to one another to form a column of row/block decoder circuits 38. In the preferred embodiment, the layout boundary of the row/block decoder circuit 37 is built to a height equal to the memory cell height. The row/block decoder circuit 37 enabled a row of memory cells in a memory block.

Figure 8:
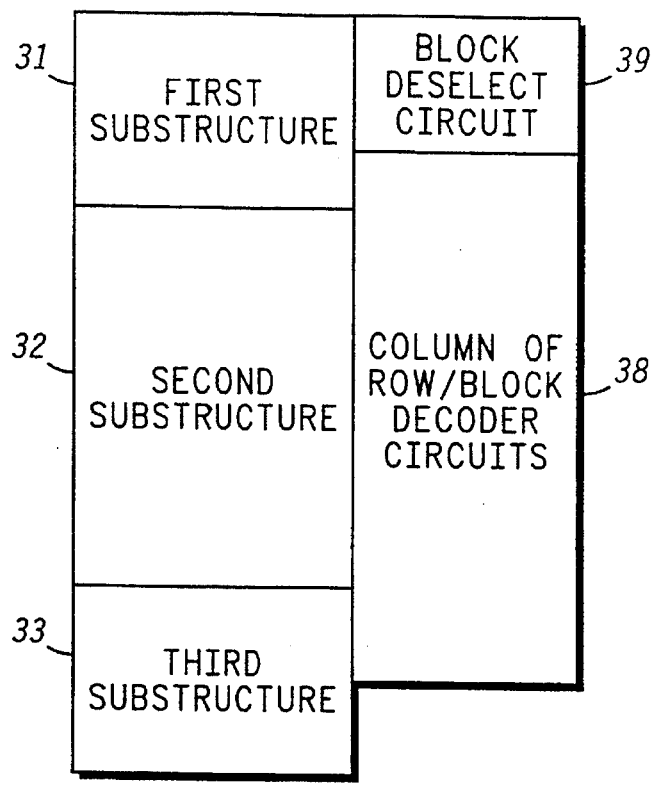
FIG. 8 illustrates the column of row/block decoders abutted to the first, second, and third substructures, with the block deselect circuit abutting the column of row/block decoder circuits.

FIG. 8 illustrates a simplified layout boundary a memory block 35. The memory block 35 has a column of row/block decoder circuits 38 abutted a first substructure 31, second substructure 32, and third substructure 33. A block deselect circuit 39 and the column of row/block decoder circuits 38 enable or select a block of memory in a SRAM having multiple memory blocks. Block level decoding allows memory access of individual substructure memory blocks to minimize power consumption.

In the preferred embodiment, each row/block decoder circuit of the column of row/block decoder circuits 38 corresponds to a memory cell row of the memory block 35. The physical layout of each row/block decoder circuit is built having the same height as a memory cell. Each row/block decoder circuit of the column of row/block decoder circuits 38 abuts a corresponding memory cell row of the first 31, second 32, or third 33 substructures.

The block deselect circuit 39 abuts the column of row/block decoders 38. The block deselect circuit 39 provides a control signal to each of the row/block decoder circuits of column of row/block decoder circuits 38.

In the preferred embodiment, the column multiplexers of third substructure 33 is built as a four to one multiplexer. A compiler that generates any column multiplexer configuration would increase SRAM flexibility (other than a 4 to 1 ratio) but would also increase compiler development and could impact performance. The four to one column multiplexers affect the SRAM word width. Memory block macro 35 having 32 memory cell columns uses eight 4 to 1 multiplexers (one multiplexer per four memory cell columns) for providing a word of eight bits. Similarly, memory block macro 35 having 36 memory cell columns has a nine bit word and memory block macro 35 having 40 memory cell columns has a ten bit word. Smaller word widths (less than 8, 9, or 10 bits) are created by adding a further stage of multiplexing after the column multiplexers to further reduce the number of inputs and outputs of the memory block 35.

Figure 9:
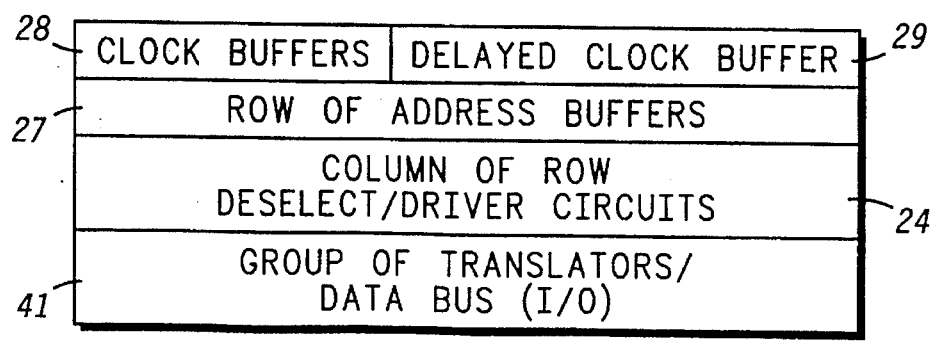
FIG. 9 illustrates simplified layout boundaries of clock buffers, a delayed clock buffer, row of address buffers, column of row deselect/driver circuits, and group of translators/data bus (I/O) abutted together.

FIG. 9 is an illustration of a central block 54. The central block 54 comprises clock buffers 28, a delayed clock buffer 29, a row of address buffers 27, a column of row deselect/driver circuits 24, and a group of translators/data bus (I/O) 41.

The output level translators or shifter is coupled to the sense amplifiers and translates the differential output of the sense amplifiers to a single-ended digital level signal. The data bus (I/O) is an interface to a data bus external to the SRAM, the data bus (I/O) enables data to be input to the SRAM or output from the SRAM. The top of the group of translators/data bus (I/O) 41 abuts the bottom of the column of row deselect/driver circuits 24.

As discussed earlier, in the preferred embodiment, the sense amplifier is divided into two separate circuits, the sense amplifier input differential circuit and the sense amplifier load circuit. The sense amplifier load circuits are placed in with the group of translators/data bus (I/O) 41.

The data bus (I/O) connects to a data bus that is external to the physical layout of the SRAM. Placement of the data bus (I/O) is designed for easy access to a data bus that is external to the SRAM and is placed in an area of the SRAM as to reduce routing contention with other signal lines that couple to the SRAM (for example a clock signal line).

Figure 10:
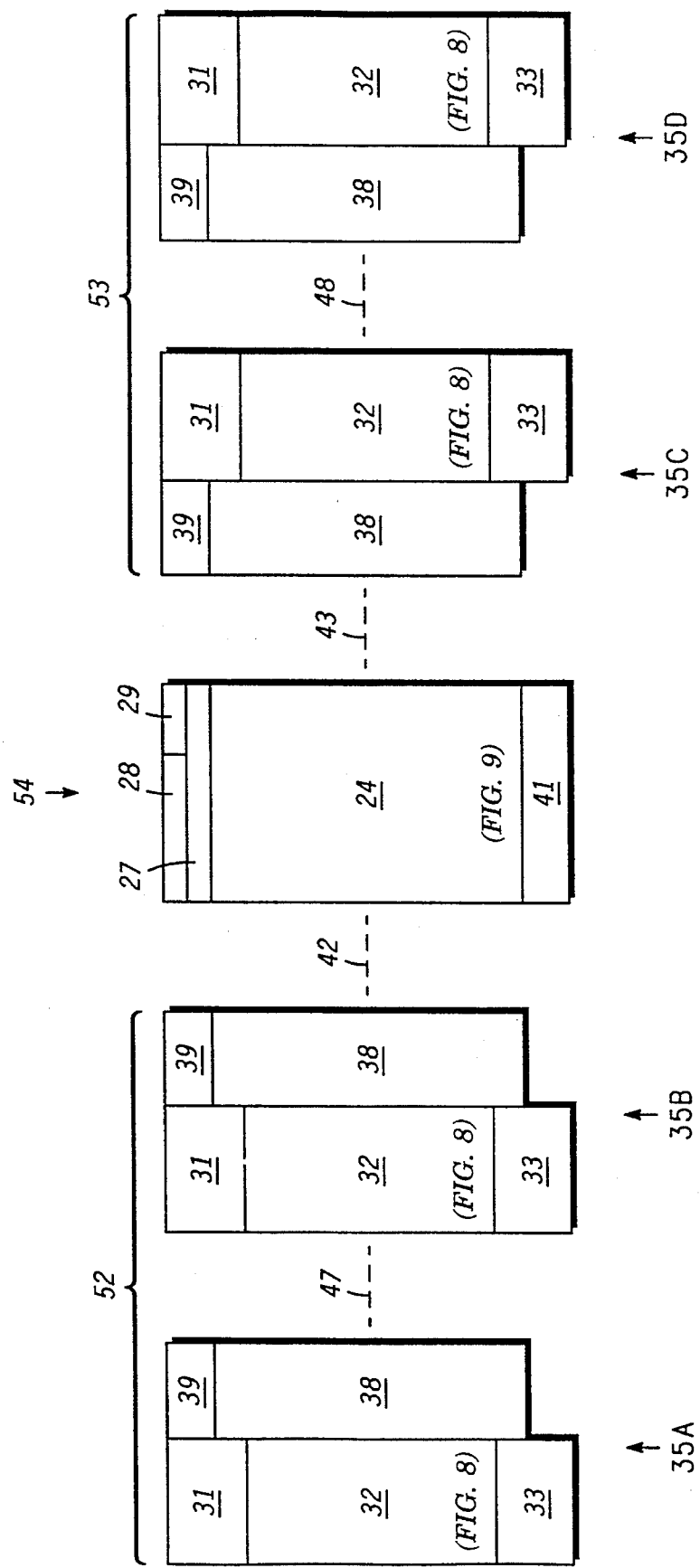
FIG. 10 illustrates a SRAM formed from more than one memory blocks, the SRAM including a central block and a plurality of memory blocks.

FIG. 10 illustrates a SRAM with a plurality of memory block macros 35. The plurality of memory block macros 35 are shown as a memory block macro 35A, memory block macro 35B, memory block macro 35C, and memory block macro 35D. In the preferred embodiment, dotted line 47 indicates how memory block macro 35A and memory block macro 35B abut together to form a first row of memory block macros 52. Dotted line 48 indicates how memory block macro 35C and memory block macro 35D abut together to form a second row of memory block macros 53.

First row of memory block macros 52 abuts the central block 54 as indicated by dotted line 42. Second row of memory block macros 53 abuts the central block 54 as indicated by dotted line 43. Delay due to interconnect resistance is reduced by minimizing the distance of the first row of memory block macros 52 from the central block 54. Similarly, the second row of memory block macros 53 is built as a mirror image of the first row of memory block macros 52 as shown in FIG. 10 to further minimize its interconnect resistance to the central block 54.

Wider word widths are made by accessing multiple memory blocks simultaneously. For example, in FIG. 10 if memory block macros 35A and 35B are enabled simultaneously a word width twice the size can be generated (example—8 bit word width output from one memory block macro, a 16 bit word width can be formed by accessing two memory block macros and combining the 8 bit outputs from each). The block decoder circuits of the plurality of memory blocks 35 are modified by the compiler to allow more than on memory block to be accessed. Furthermore, additional translators/data bus (I/O) are required to increase the number of data bus inputs and outputs.

The method for building a compiled block architected SRAM is illustrated in FIG. 10. Prior art memory compilers are typically limited to a single block of memory due to the complexity of building a SRAM compiler that generates any memory configuration. Both memory access speeds and the size of the SRAM suffer when memory configurability is highest priority. In general, memory access times are reduced when using multiple blocks of memory in place of a single block of memory in a large SRAM. A smaller memory block presents a smaller capacitive load to a memory cell and decoding circuitry when being accessed for a read or write operation. A memory cell is associated with a memory row and a memory column within a memory block. It is well known that a memory row presents a capacitive load to the decode circuitry while the memory column presents a capacitive load to the memory cell. The amount of delay corresponds to the amount of capacitive loading on the decode circuitry and memory cell.

A SRAM having multiple memory blocks does pay a slight penalty with an additional stage of decoding. A block deselect circuit and row/block decoder circuits are added to the SRAM for selecting a memory block. The added delay of this extra decoding stage is more than compensated by the delay reduction due to the smaller memory block size.

The compiled block architected SRAM is has a physical layout optimized to maximize speed through the SRAM worst case delay path. The fixed layout of some of the circuits is still configurable for most memory sizes and memory word widths although it does reduce the number of different layout configurations of the SRAM which can be built or formed by the compiler.

The compiled block architected SRAM is one of many components which is used to build an ASIC circuit. Routing or interconnecting between large circuit blocks is a major design problem in an ASIC circuit. The SRAM of FIG. 10 has address inputs and clock buffer inputs on opposite sides from data bus I/O to minimize routing congestion.

The central block 54 minimizes delay by placing the clock buffers 28, delayed clock buffer 29, and row of address buffer circuits 27 next to the column of row deselect/driver circuits 24. Each row deselect/driver circuit of the column of row deselect/driver circuits 24 has an output that is coupled to a corresponding row/block decoder of the column of row/block decoder circuits 38 from the plurality of memory blocks 35. Equally distributing the memory blocks (35 A,B and 35 C,D) on either side of the central block 54 minimizes resistance due to interconnect on the row decoder/driver outputs of the column of row/block decoder circuits 38. Similarly, translators/data bus (I/O) 41 are placed in the central block 54 to minimize interconnect resistance when coupled to the memory block macros (35A, 35B, 35C, and 35D).

The compiler builds or forms the row deselect/driver circuits 24 for the number of memory cell rows in the SRAM. All other circuits in the central block 54 are fixed layouts. The compiler replicates and abuts these circuits together based on the SRAM configuration. The central block 54 represents the first of two structures which are used to build the block architected SRAM.

The second structure is a memory block (35 A,B,C, and D). In the second structure, the compiler builds or forms the block deselect circuit 39 for the number of memory blocks in the SRAM. All other circuits in the memory block is a fixed layout. Replication of circuits within the memory block is limited to the second substructure 32 and the column of row/block decoder circuits 38. The physical layout of the memory block is formed by abutment. The number of SRAM configurations is limited by fixing the number of memory cell columns to 32 memory cell columns, 36 memory cell columns, or 40 memory cell columns. The SRAM architecture is varied by choosing by increasing or decreasing the number of memory blocks or memory cell rows.

A block architected SRAM is built from the central block 54 and the plurality of memory blocks (35a, 35b, 35c, and 35d) as shown in FIG. 10. The memory size, word width, and access time requirements determine the number of memory cell rows, the number of memory cell columns, and the number of memory blocks. The compiler analyzes the SRAM requirements and determines the optimum configuration for the specific application or determines if the SRAM specifications cannot be met. The compiler builds the central block 54 and a memory block. The compiler then replicates or forms the plurality of memory blocks 35 and forms the two rows of memory blocks. The rows of memory blocks (35 A,B and 35 C,D) abut the central block 54 forming the block architected SRAM.

The placement of components in the SRAM critical delay path are shown in FIG. 10. Other non-critical delay path components such as column decoders or read/write input buffered are placed in areas that do not impact performance. The critical delay path is composed of the circuits through the SRAM which determine the SRAM read/write access time. Building the SRAM in this structured fashion reduces the number of components that must be manipulated by the compiler, reduces the number of permutations for a given size memory (minimizing the chance for a non-functional configuration), and optimizes SRAM access time by minimizing the distance between components in the critical delay path.

FIG. 11 illustrates a row and block decoding architecture of a SRAM.

Clock buffers 28 start a row and block decoding sequence in the SRAM. The clock buffers 28 have an input coupled to the clock input 62, outputs 63 and 65, and memory select inputs. The memory select inputs enable or disable the clock buffers 28 from strobing. This feature saves power by deactivating the SRAM when the memory select inputs receive a disable signal. The output 63 of the clock buffers 28 are coupled to address buffers 64 and 69. The output 65 of the clock buffers 28 is coupled to other circuitry (not shown) to control internal SRAM timings other than row and block decoding that are not in the SRAM worst case delay path.

Address buffers 69 have first address inputs 71 that couple to an address bus (not shown), address outputs 72, and complementary address outputs 73. The address buffers 69 buffer a block address applied to the first address inputs 71 from capacitive loads internal to the SRAM. Each block deselect circuit of block deselect circuits 39 are coupled for receiving address outputs 72 and complementary address outputs 73 of address buffers 69 and has a block deselect output 85.

In the preferred embodiment, prior to starting a row and block decode sequence all address outputs 72 and complementary address outputs 73 of address buffers 69 are in a logic zero state. All block deselect outputs 85 are in a logic state which corresponds to a select condition. Upon receiving a clock signal, clock buffer 28 strobes address buffers 69 generating block address signals that are received by block deselect circuits 39. Decoding is by deselection. Any block address signal received by a block deselect circuit 39 transitioning from a select logic level to a deselect logic level causes block deselect circuit 39 to provide a logic level corresponding to a deselect condition. Conversely, a block deselect circuit 39 receiving a unique block address will remain in the select condition. Each block deselect output 85 is coupled to a plurality of row/block decoder circuits 37.

Address buffers 64 have address inputs 66 for receiving a row address, address outputs 67, and complementary address outputs 68. Address outputs 67 and complementary address outputs 68 are coupled to row deselect circuits 21. Each row deselect circuit 21 receives a unique combination of row address signals and includes a row deselect output 77. In the preferred embodiment, prior to starting the row and block decode sequence, all address outputs 67 and complementary address outputs 68 are at a logic zero state. All row deselect outputs of the row deselect circuits 21 are in a logic state which corresponds to a select condition. Upon receiving a clock signal, clock buffer 28 strobes address buffers 64 providing address signals that are applied to row deselect circuits 21. Decoding is by deselection. Any address signal received by a row deselect circuit 21 transitioning from a select logic level to a deselect logic level causes the row deselect circuit 21 to provide a logic level corresponding to a deselect condition. Conversely, a row deselect circuit 21 receiving address signals which do not change logic state (remain at a select logic level) will remain in the select condition.

Delayed clock buffer 29 delays the clock signal by a predetermined time. The predetermined time generated by delayed clock buffer 29 is greater than a combined total delay of a worst case delay path comprising elements: clock buffer 28, address buffers 64, and row deselect circuits 21. Output 83 of the delayed clock buffer 29 is coupled to a plurality of row driver circuits 22. Each row deselect circuit 21 corresponds to a row driver circuit 22. Each row deselect output 77 of the row deselect circuits 21 is coupled to a corresponding row driver circuit 22.

Row deselect outputs 77 of the row deselect circuits 21 are in a logic state corresponding to a select condition prior to starting a row and block decode sequence. Delayed clock buffer 29 prohibits row driver circuits 22 from generating a logic state corresponding to a select condition before row deselect circuits 21 have stabilized to a final logic state. Delayed clock buffer 29 strobes row driver circuits 22 after row deselect outputs 77 have stabilized to a final logic state. A row deselect output 77 remaining in a select condition causes a corresponding row driver output 79 to change from a deselect condition to a select condition.

Row/block decoder circuits 37 each have an output that is coupled to a corresponding memory cell row of memory blocks 89. Each of the memory blocks 89 is an array of memory cells that is defined by memory cell rows and memory cell columns. The memory blocks 89 break the SRAM up into small memories each of which is accessed through the row and block decoding architecture of the SRAM. The memory blocks 89 reduce capacitive loading on the row/block decoder circuits 37 which drive the memory cell rows thereby decreasing access time speeds. Power is also reduced by accessing only the memory blocks needed.

The column of row/block decoder circuits 38 (comprising row/block decoder circuits 37) activates a memory row for memory access. Each row/block decoder circuit 37 is coupled for receiving a corresponding row driver output 79 and a corresponding block deselect output 85. A row/block decoder circuit 37 activates a memory row when its corresponding row driver output 79 and block deselect output 85 are both in a select logic level.

In the preferred embodiment, a signal path propagating through clock buffer 28, address buffers 69, and block deselect circuits 39 selects or deselects row/block decoder circuits 37 of each substructure memory block 89 before a signal path propagating through delayed clock buffer 29 and row driver circuits 22 selects or deselects row/block decoder circuits 37. Four outcomes are possible in a row and block decode sequence with the above mentioned timing conditions.

In a first condition, both a block deselect output 85 and a row driver output 79 provide deselect signals. A row/block decoder circuit 37 will not activate a memory row in a memory block 89 upon receiving both deselect signals.

In a second condition, a block deselect output 85 is deselected and a row driver output 79 is selected. A row/block decoder circuit 37 will not activate a memory row in a memory block 89 upon receiving the deselect signal from the block deselect output 85.

In a third condition, a block deselect output 85 is selected and a row driver output 79 is deselected. A row/block decode circuit 37 will not activate a memory row in a memory block 89 upon receiving the deselect signal from the row driver output 79.

In a fourth condition, a block deselect output 85 is selected and a row driver output 79 is selected. A row/block decode circuit 37 will enable a memory row in a memory block 89 upon receiving both select signals.

Although column decoder circuitry (not shown) is used in the SRAM it is not in the SRAM worst case delay path. The column decoder circuitry enables the column multiplexers in each memory block. The column decoder circuitry is implemented using standard decoding logic (generating an enable signal) or the deselection process disclosed herein.

Using deselection as the decoding process serves many purposes in a SRAM architecture. First, having the clock buffers start a row and block decode sequence allows all timing to be accurately controlled. Second, the clock buffers prohibit a row and block decode sequence from starting which allows precharging to be used to preset voltage states in circuits which comprise a row and block decoder stage prior to the start of the decode sequence. Precharging also reduces parasitic capacitance (and thus increases speed) by reducing the number of devices needed to build a logic gate.

Second, precharging presets a logic gate output in a logic state thereby eliminating the need for active circuitry to put it in the preset condition (based on logic gate input states). Third, having clocked address buffers enables the address outputs to be preset to a logic zero state prior to the start of the row and block decode sequence thereby simplifying row and block decoding circuitry.

In general, n-channel enhancement metal oxide semiconductor field effect transistors (MOSFETs) coupled in parallel (forming a parallel chain) are used in a row or block decoder. The n-channel enhancement MOSFETs have common drains, common sources tied to ground, a common bulk tied to ground, and gates are coupled to predetermined address inputs. All row and block address inputs are in the logic zero state (select logic level) prior to starting a decode sequence thereby disabling all n-channel MOSFETS in the parallel chain of a row or block decoder. The number of n-channel enhancement MOSFETs in a parallel chain form a row or block decoder circuit respectively for a predetermined number of memory cell rows or a predetermined number of memory blocks, while other circuitry in a decoder need not change. A physical layout of a parallel chain of n-channel enhancement MOSFETs is produced by tiling or placing a predetermined number of transistor layouts next to one another such that they are coupled in parallel.

From a logic function viewpoint, deselection optimizes speed when using a complementary metal oxide semiconductor (CMOS) process devices because n-channel enhancement MOSFETs typically have carrier mobilities faster than p-channel enhancement MOSFETs (usually 2.5 to 3 times faster). A decoding process by deselection is created by presetting the outputs of a row or a block decode stage to a select condition. Once a row or block decode sequence starts, any address signal at the input of a row or block decoder circuit changing from the logic zero state to a logic one state turns on a n-channel MOSFET of the parallel chain of n-channel MOSFETs causing the output state of the decoder to transition from the preset select condition to a deselect condition.

Row and block decoders having inputs which remain in a logic zero state will remain in the select condition. Conversely, if a standard selection process is used, one of the row decoders or block decoders would generate a select condition. The selection process would require the use of p-channel enhancement MOSFETs which are significantly slower than the n-channel enhancement MOSFETs.

Fourth, the delayed clock signal prohibits every memory cell row in each memory block from being enabled. The delayed clock disables a row driver circuit 22 from generating a select condition until the delayed clock signal is received. The delayed clock is delayed by a predetermined amount of time to arrive after row deselect circuits 21 have stabilized to a final logic state. The amount of delay provided by the delayed clock buffer 29 is accurately controlled by the MOSFET geometries of the transistors which form the delayed clock buffer 29. The row driver outputs 79 are preset to a deselect condition. The row driver circuit 22 enables a corresponding memory cell row when the row driver circuit 22 receives a logic level corresponding to a select condition from a corresponding row deselect circuit 21 and a delayed clock signal from the delayed clock buffer 29. In the preferred embodiment, block deselect outputs 85 are at a final logic state before a row driver circuit 22 generates a select condition to prevent a condition where a memory row is enabled when it is not selected.

Finally, a row/block decoder circuit 37 having both a corresponding block deselect output 85 and row driver output 79 in a select condition will enable the memory cell row to which it is coupled. In summary, the row and block decode architecture worst case delay path comprises delayed clock buffer 29, row driver circuits 22, and row/block decoder circuits 38.

By now it should be appreciated that there has been provided a SRAM architecture that is flexible for providing different SRAM configurations and is adaptable for being implemented as a memory compiler. The approach is based on a block architecture which is configurable for different SRAM sizes and word widths yet simplify construction of a physical layout. The SRAM architecture provides a worst case delay path which minimizes interconnect distance. The row and block decode architecture utilizes the process of deselection for decoding. The technique optimizes speed by having the row deselect circuits 21 and block deselect circuits in a select condition before the start of the row and block decode sequence. Row deselect circuits 21 and block deselect circuits 39 reduce the complexity required to build or form a physical layout for different SRAM configurations. Row deselect circuits 21 and block deselect circuits minimize circuit changes when memory cell row counts and memory block macro counts are varied.

I claim:

1. A method for decoding comprising the steps of:

initializing an output of each decoder to a select condition prior to a decode sequence;

applying an address to each decoder; and deselecting each decoder except one decoder corresponding to said address wherein deselecting changes the output of a decoder from said select condition to a deselect condition.

2. A Static Random Access Memory (SRAM) having decode circuitry for enabling at least one memory cell of the SRAM to be coupled to bit lines for a read or write operation, the SRAM includes a block of memory, the block of memory has a plurality of memory cell rows, each row of the block of memory has a corresponding row decode circuit, the SRAM wherein a decode sequence begins with each row decode circuit being in a select condition for providing a signal for enabling a corresponding memory cell row, wherein said decode sequence changes said plurality of row decode circuits from said select condition to a non-selected condition such that a remaining row decode circuit does not change to a non-selected condition and enables said corresponding memory cell row for being coupled to bit lines for said read or write operation.

3. A decode stage for accessing a memory row in a SRAM comprising:

a plurality of row deselect circuits each having a plurality of inputs and an output, each row deselect circuit corresponds to a memory cell row of the SRAM, said output of each row deselect circuit being initialized to a select condition prior to a decode sequence wherein one of said plurality of row deselect circuits remains in said select condition after an address is applied to said plurality of inputs of each of said plurality of row deselect circuits.

4. The decode stage as recited in claim 3 further including:

a plurality of clocked address buffer circuits for providing address signals to said plurality of inputs of each of said row deselect circuits wherein a clock signal starts said decode sequence and enables said plurality of clocked address buffer circuits for providing an address each of said plurality of row deselect circuits.

5. The decode stage as recited in claim 4 further including:

a plurality of row driver circuits each having an input, a delayed clock input, and an output, said input of each row driver circuit coupling to an output of a corresponding row deselect circuit;

a clock buffer for providing said clock signal; and a delayed clock buffer for providing a delayed clock signal delayed by a predetermined time period from said clock signal.

6. The decode stage as recited in claim 5 wherein said delayed clock signal disables said row driver circuit from providing a row enable signal for said predetermined time period after said clock signal.

7. The decode stage as recited in claim 6 wherein all but one row deselect circuit changes from a select condition to a deselect condition during said decode sequence prior to said delayed clock signal being applied to said row driver circuit and wherein said remaining row deselect circuit in said select condition enables said row driver circuit for providing said row enable signal upon receiving said delayed clock signal.

8. The decode stage as recited in claim 7 further including:

a plurality of block deselect circuits each having a plurality of inputs and an output, each block deselect circuit corresponds to a memory block of the SRAM, said output of each block deselect circuit being in a select condition prior to a decode sequence, and said output of each row deselect circuit remains in said select condition for a unique address applied to said plurality of inputs, a plurality of clocked block address buffers for providing address signals to said plurality of inputs of each of said block deselect circuits wherein said clock signal enables said plurality of clocked block address buffers for providing an address to each of said plurality of block deselect circuits.

9. The decode stage as recited in claim 8 wherein some of said block deselect circuits change from a select condition to a deselect condition during said decode sequence.

10. The decode stage as recited in claim 9 further including a plurality of row/block decoder circuits each having an row input, a block input, and an output, said row input of each row/block decoder circuit coupling to an output of a corresponding row driver circuit, said block input of each row/block decoder circuit coupling to an output of a corresponding block deselect circuit wherein a select condition from both said corresponding row driver circuit and said block deselect circuit causes said row/block decoder circuit to enable a memory row within a memory block.

* * * * *